(12) United States Patent
Astle et al.

(10) Patent No.: US 10,744,529 B2
(45) Date of Patent: Aug. 18, 2020

(54) MATERIALS FOR MASKING SUBSTRATES AND ASSOCIATED METHODS

(71) Applicant: HZO, Inc., Draper, UT (US)

(72) Inventors: David James Astle, Park City, UT (US); Tyler Christensen Child, South Jordan, UT (US); Vimal Kumar Kasagani, Taylorsville, UT (US); Cameron LaMar Loose, Roy, UT (US); Blake LeRoy Stevens, Morristown, NJ (US); Max Ernest Sorenson, Herriman, UT (US)

(73) Assignee: HzO, Inc., Morrisville, NC (US)

( * ) Notice: Subject to any disclaimer, the term of this patent is extended or adjusted under 35 U.S.C. 154(b) by 0 days.

(21) Appl. No.: 14/842,802

(22) Filed: Sep. 1, 2015

(65) Prior Publication Data

US 2015/0375260 A1 Dec. 31, 2015

Related U.S. Application Data

(63) Continuation of application No. 14/157,684, filed on Jan. 17, 2014, which is a continuation of application No. PCT/US2014/010526, filed on Jan. 7, 2014.

(Continued)

(51) Int. Cl.
*B05D 1/00* (2006.01)
*B05D 1/32* (2006.01)
(Continued)

(52) U.S. Cl.
CPC ................ *B05D 1/322* (2013.01); *C09J 9/00* (2013.01); *H01L 21/56* (2013.01); *H01L 21/561* (2013.01);
(Continued)

(58) Field of Classification Search
CPC ........... B05D 1/00; C09J 9/00; C09J 2201/61; H01L 21/00; H01L 23/00; H05K 1/00; H05K 3/00; H05K 2201/09872
See application file for complete search history.

(56) References Cited

U.S. PATENT DOCUMENTS 3,661,641 A 5/1972 Vigh et al.
3,670,091 A 6/1972 Frantz et al.
(Continued)

FOREIGN PATENT DOCUMENTS

CN 1826710 A 8/2006
CN 101442896 A 5/2009
(Continued)

OTHER PUBLICATIONS

"Luminescent Organometallic Complexes as Visible Probes in the Isothermal Curing of Epoxy Resins", Thomas G. Kotch and Alistair J. Lees, Chem. Mater. 1992, 4, pp. 675-683.*
(Continued)

*Primary Examiner* — David P Turocy
*Assistant Examiner* — Mohammad Mayy
(74) *Attorney, Agent, or Firm* — Intellectual Strategies

(57) ABSTRACT

A mask material is readily discernible from a substrate to which the mask material is applied. The mask material may have a discernible characteristic, such as its color, luminescence or the like, which may render it visibly distinct from the substrate or detectable using automated inspection equipment. The discernible characteristic of the mask material may render it detectable through a protective coating.

13 Claims, 2 Drawing Sheets

Related U.S. Application Data

(60) Provisional application No. 61/750,254, filed on Jan. 8, 2013, provisional application No. 61/750,257, filed on Jan. 8, 2013.

(51) Int. Cl.

| | |
|---|---|
| *H01L 21/67* | (2006.01) |
| *H01L 21/56* | (2006.01) |
| *H05K 3/28* | (2006.01) |
| *H05K 3/00* | (2006.01) |
| *H05K 1/18* | (2006.01) |
| *C09J 9/00* | (2006.01) |
| *H01L 23/31* | (2006.01) |

(52) U.S. Cl.
CPC .... *H01L 21/67011* (2013.01); *H01L 21/6715* (2013.01); *H05K 1/181* (2013.01); *H05K 3/0079* (2013.01); *H05K 3/284* (2013.01); *C09J 2201/61* (2013.01); *H01L 23/3121* (2013.01); *H01L 2924/0002* (2013.01); *H05K 3/0073* (2013.01); *H05K 2201/0145* (2013.01); *H05K 2201/09872* (2013.01)

(56) References Cited

U.S. PATENT DOCUMENTS

| | | | |
|---|---|---|---|
| 3,892,892 A * | 7/1975 | Hofer | B05D 1/60 427/272 |
| 4,059,708 A | 11/1977 | Heiss, Jr. et al. | |
| 4,234,357 A | 11/1980 | Scheppele | |
| 4,254,174 A | 3/1981 | Flanders et al. | |
| 4,255,469 A | 3/1981 | McGinness | |
| 4,300,184 A | 11/1981 | Colla | |
| 4,495,254 A | 1/1985 | Hoffman | |
| 4,528,261 A | 7/1985 | Hauser | |
| 4,631,250 A | 12/1986 | Hayashi | |
| 4,784,310 A | 11/1988 | Metzger et al. | |
| 4,814,943 A | 3/1989 | Okuaki | |
| 4,885,187 A | 12/1989 | Koenig | |
| 5,009,311 A | 4/1991 | Schenk | |
| 5,024,879 A | 6/1991 | Massa et al. | |
| 5,102,712 A | 4/1992 | Peirce et al. | |
| 5,176,312 A | 1/1993 | Lowenthal | |
| 5,184,427 A | 2/1993 | Armstrong | |
| 5,188,669 A | 2/1993 | Donges et al. | |
| 5,246,730 A | 9/1993 | Peirce et al. | |
| 5,271,953 A | 12/1993 | Litteral | |
| 5,456,955 A | 10/1995 | Muggli | |
| 5,460,767 A * | 10/1995 | Sanftleben | B29C 39/021 156/155 |
| 5,536,282 A | 7/1996 | Yoon et al. | |
| 5,543,008 A | 8/1996 | Hidber et al. | |
| 5,587,207 A | 12/1996 | Gorokhovsky | |
| 5,708,056 A * | 1/1998 | Lindley | C08G 59/18 523/220 |
| 5,885,854 A * | 3/1999 | Wensel | H01L 21/312 257/E21.259 |
| 5,888,308 A | 3/1999 | Sachdev et al. | |
| 5,925,069 A | 7/1999 | Graves et al. | |
| 5,989,622 A * | 11/1999 | Iwashita | B05C 5/0254 427/256 |
| 6,043,437 A | 3/2000 | Schulman et al. | |
| 6,060,683 A | 5/2000 | Estrada | |
| 6,138,349 A | 10/2000 | Vinciarelli et al. | |
| 6,280,821 B1 | 8/2001 | Kadunce et al. | |
| 6,306,688 B1 | 10/2001 | Lunceford | |
| 6,369,887 B2 * | 4/2002 | Eyolfson | G01N 21/4738 250/458.1 |
| 6,447,847 B1 | 9/2002 | Hynes et al. | |
| 6,592,018 B2 | 7/2003 | Taylor et al. | |
| 6,635,510 B1 | 10/2003 | Kraft et al. | |
| 6,635,553 B1 | 10/2003 | DiStefano et al. | |
| 6,697,217 B1 | 2/2004 | Codilian | |
| 6,793,544 B2 | 9/2004 | Brady et al. | |
| 6,940,022 B1 | 9/2005 | Vinciarelli et al. | |
| 6,956,963 B2 | 10/2005 | Ulrich et al. | |
| 6,980,647 B1 | 12/2005 | Daugherty et al. | |
| 7,109,055 B2 | 9/2006 | McDonald et al. | |
| 7,273,767 B2 | 9/2007 | Ong et al. | |
| 7,632,698 B2 | 12/2009 | Hooper et al. | |
| 7,681,778 B2 | 3/2010 | Gottshall et al. | |
| 7,897,881 B2 | 3/2011 | Kaspar et al. | |
| 8,002,948 B2 | 8/2011 | Haubrich et al. | |
| 8,408,379 B2 | 4/2013 | Malek et al. | |
| 8,544,781 B2 | 10/2013 | Pan et al. | |
| 2002/0088636 A1 | 7/2002 | Noguchi et al. | |
| 2002/0170897 A1 | 11/2002 | Hall | |
| 2002/0187260 A1 | 12/2002 | Sheppard et al. | |
| 2003/0143845 A1 | 7/2003 | Mori et al. | |
| 2004/0056039 A1 | 3/2004 | Sarajian | |
| 2004/0058070 A1 | 3/2004 | Takeuchi et al. | |
| 2004/0065554 A1 | 4/2004 | Cohen | |
| 2004/0100164 A1 | 5/2004 | Murata et al. | |
| 2005/0008848 A1 | 1/2005 | Saccomanno et al. | |
| 2005/0081354 A1 | 4/2005 | Motzno et al. | |
| 2005/0179140 A1 | 8/2005 | Goodner et al. | |
| 2006/0013961 A1 | 1/2006 | Fournier et al. | |
| 2006/0042659 A1 | 3/2006 | Fernandez et al. | |
| 2006/0199408 A1 | 9/2006 | Hoisington et al. | |
| 2006/0264153 A1 | 11/2006 | Jaubertie | |
| 2006/0283539 A1 * | 12/2006 | Slafer | B05D 1/28 156/230 |
| 2007/0087131 A1 | 4/2007 | Hutchinson et al. | |
| 2007/0095368 A1 | 5/2007 | Girard et al. | |
| 2007/0157457 A1 | 7/2007 | Fried | |
| 2007/0206365 A1 | 9/2007 | Shiu et al. | |
| 2007/0246820 A1 | 10/2007 | Zohni et al. | |
| 2008/0147158 A1 | 6/2008 | Zweber et al. | |
| 2008/0283180 A1 | 11/2008 | Bachman et al. | |
| 2009/0044900 A1 * | 2/2009 | Suehara | B32B 38/10 156/239 |
| 2009/0263581 A1 | 10/2009 | Martin, III et al. | |
| 2009/0263641 A1 | 10/2009 | Martin, III et al. | |
| 2009/0283574 A1 | 11/2009 | Okazaki et al. | |
| 2009/0301770 A1 | 12/2009 | Cho et al. | |
| 2009/0304549 A1 | 12/2009 | Coulson | |
| 2010/0124010 A1 | 5/2010 | Shiu et al. | |
| 2010/0159699 A1 | 6/2010 | Takahashi | |
| 2010/0173474 A1 * | 7/2010 | Arita | H01L 21/78 438/462 |
| 2010/0203347 A1 | 8/2010 | Coulson | |
| 2010/0203457 A1 * | 8/2010 | Hatakeyama | G03F 1/32 430/326 |
| 2010/0277921 A1 | 11/2010 | Sekowski et al. | |
| 2010/0293812 A1 | 11/2010 | Coulson | |
| 2011/0090658 A1 | 4/2011 | Adams et al. | |
| 2011/0094514 A1 | 4/2011 | Rakow et al. | |
| 2011/0141205 A1 | 6/2011 | Gerner et al. | |
| 2011/0231002 A1 | 9/2011 | Vienot et al. | |
| 2011/0253429 A1 | 10/2011 | Humphries et al. | |
| 2011/0262740 A1 | 10/2011 | Martin, III et al. | |
| 2011/0316166 A1 * | 12/2011 | Yu | H01L 21/76898 257/774 |
| 2012/0070145 A1 | 3/2012 | Wong et al. | |
| 2012/0146212 A1 | 6/2012 | Daubenspeck et al. | |
| 2012/0193648 A1 | 8/2012 | Donofrio et al. | |
| 2012/0296032 A1 | 11/2012 | Legein et al. | |
| 2013/0174410 A1 | 7/2013 | Stevens et al. | |
| 2013/0176691 A1 | 7/2013 | Stevens et al. | |
| 2013/0176700 A1 | 7/2013 | Stevens et al. | |
| 2013/0251889 A1 | 9/2013 | Cox et al. | |
| 2013/0286567 A1 | 10/2013 | Sorenson et al. | |
| 2013/0335898 A1 | 12/2013 | Stevens et al. | |

FOREIGN PATENT DOCUMENTS

| | | |
|---|---|---|
| CN | 102150480 A | 8/2011 |
| CN | 102171852 A | 8/2011 |
| CN | 102655949 | 9/2012 |
| EP | 0350031 A2 | 1/1990 |
| EP | 0474194 A2 | 3/1992 |

(56) References Cited

FOREIGN PATENT DOCUMENTS

| GB | 697492 | A | * | 9/1953 | ............. B65D 23/02 |
|---|---|---|---|---|---|
| JP | 62-248228 | | | 10/1987 | |
| JP | 07-302808 | A | | 11/1995 | |
| JP | 2000-299066 | A | | 10/2000 | |
| JP | 2002-043702 | A | | 2/2002 | |
| JP | 2005-079225 | A | | 3/2005 | |
| JP | 2005-172083 | A | | 6/2005 | |
| JP | 2005-260106 | A | | 9/2005 | |
| JP | 2007-279616 | A | | 10/2007 | |
| JP | 2008-018476 | A | | 1/2008 | |
| JP | 2009-505386 | A | | 2/2009 | |
| JP | 2009-178805 | A | | 8/2009 | |
| JP | 2009-292135 | A | | 12/2009 | |
| JP | 2010-225715 | A | | 10/2010 | |
| JP | 2012-500487 | A | | 1/2012 | |
| KR | 20000047683 | A | * | 7/2000 | |
| WO | WO-2007/138302 | A1 | | 12/2007 | |
| WO | WO-2010/020753 | A2 | | 2/2010 | |
| WO | WO-2011/037921 | A1 | | 3/2011 | |
| WO | WO-2011/089009 | A1 | | 7/2011 | |
| WO | WO-2012/106109 | A1 | | 8/2012 | |
| WO | WO-2013/106442 | A1 | | 7/2013 | |
| WO | WO-2014/110039 | A2 | | 7/2014 | |
| WO | WO-2014/110106 | A1 | | 7/2014 | |

OTHER PUBLICATIONS

Technical Data Bulletin, EPON™ Resin 828, 2005.*
Technical Data Sheet, EPON™ Resin 1004F, 2007.*
Ciba Specialty Chemicals, Data Sheet, 1998.*
P-Xylene MSDS, 2005.*
Photolithography, Darling, 2001.*
KR20000047683A Google Patents.*
Chinese State Intellectual Property Office, "Notification of the First Office Action and Search Report," dated Jun. 2, 2015 in Chinese application No. 201480000038.7.
Chinese State Intellectual Property Office, "Notification of the First Office Action and Search Report," dated Mar. 25, 2015 in Chinese application No. 201480000037.2.
Chinese State Intellectual Property Office, "Notification of the Second Office Action and Search Report," dated Apr. 4, 2016 in Chinese application No. 201480000038.7.
Christina Schmiedel et al., "Combined Plasma Laser Removal of Parylene Coatings," ISPC Conference, 2009, Bochum, Germany, accessible online www.ispc-conference.org/ispcproc/papers/239.pdf.
European Search Report for EP14700800.7, dated Oct. 14, 2015.
Office Action for Japanese Patent Application No. 2014-556841, dated Oct. 23, 2015.
PCT patent application PCT/US14/10638 filed on an IDS as a foreign reference on Jan. 17, 2014, but considered a NPL by the USPTO.
United States Patent and Trademark Office Acting As the International Searching Authority, "International Search Report and Written Opinion," dated Aug. 21, 2014 in related international application No. PCT/US2014/010510.
United States Patent and Trademark Office acting as the International Searching Authority, "International Search Report and Written Opinion," dated Apr. 24, 2014 in related international application No. PCT/US2014/010638.
United States Patent and Trademark Office acting as the International Searching Authority, "International Search Report and Written Opinion," dated Apr. 30, 2014, in related PCT application No. PCT/US2014/010526.
United States Patent and Trademark Office acting as the International Searching Authority, "International Search Report and Written Opinion," dated Dec. 2, 2013 in related international application No. PCT/US2013/046371.
United States Patent and Trademark Office acting as the International Searching Authority, "International Search Report and Written Opinion," dated Mar. 13, 2013, in PCT application No. PCT/US2013/020850.
United States Patent and Trademark Office acting as the International Searching Authority, "International Search Report and Written Opinion," dated Nov. 29, 2013 in corresponding application No. PCT/US2013/046392.

* cited by examiner

MATERIALS FOR MASKING SUBSTRATES AND ASSOCIATED METHODS

CROSS-REFERENCE TO RELATED APPLICATIONS

This application is a continuation-in-part of U.S. patent application Ser. No. 14/157,684, filed on Jan. 17, 2014, and titled MASKING SUBSTRATES FOR APPLICATION OF PROTECTIVE COATINGS ("the '684 Application"), pending, which is a continuation of International patent application no. PCT/US2014/010526, filed on Jan. 7, 2014, and titled MASKING SUBSTRATES FOR APPLICATION OF PROTECTIVE COATINGS ("the '526 PCT Application"), which claims the benefit of priority under 35 U.S.C. § 119(e) to the Jan. 8, 2013, filing dates of U.S. Provisional Patent Application No. 61/750,257, titled METHODS FOR REMOVING PROTECTIVE COATING FROM AREAS OF AN ELECTRONIC DEVICE ("the '257 Provisional Application"), and U.S. Provisional Patent Application No. 61/750,254, titled METHODS FOR MASKING ELECTRONIC DEVICES FOR APPLICATION OF PROTECTIVE COATINGS AND MASKED ELECTRONIC DEVICES ("the '254 Provisional Application"). The entire disclosures of the '684 Application, the '526 PCT Application, the '254 Provisional Application and the '257 Provisional Application are hereby incorporated herein.

TECHNICAL FIELD

This disclosure relates generally to materials and techniques for masking substrates, such as components of electronic devices, electronic subassemblies and electronic assemblies and electronic devices prior to depositing other materials onto the same. This disclosure relates more specifically to the use of hot melt adhesives to mask substrates and, even more specifically, to the use of hot melt adhesives that are readily discernible from the substrates to which they are applied.

SUMMARY

Various aspects of techniques for masking substrates, including, but not limited to, components of electronic devices, subassemblies of components of electronic devices, assemblies of components of electronic devices and electronic devices (collectively, "electronic substrates"), are disclosed. Masking of substrates may be accomplished by use of a flowable and optionally consolidatable mask material (e.g., a thermoplastic material (such as a hot melt adhesive), a curable resin, a synthetic grease, etc.) which may be readily discernible when applied to a substrate.

In one aspect, this disclosure relates to hot melt adhesives that have been configured for use as selective masking materials, or "mask materials." Since it is used as a selective masking material, the hot melt adhesive may be formulated or otherwise configured, once it has solidified, to withstand parameters of subsequent processing that will occur while the hot melt adhesive remains in place on a substrate. The hot melt adhesive may also be configured for ready removal from the substrate (e.g., by peeling, etc.) after a selectively formed mask comprising the hot melt adhesive is no longer needed.

A hot melt adhesive may be configured to be readily discernible from the substrate to which it is applied (e.g., the entire substrate, features surrounding the location(s) of the substrate to which the hot melt adhesive is to be applied, etc.). Such ready discernibility may be present before the hot melt adhesive has solidified (i.e., cooled and hardened), after the hot melt adhesive has solidified and following processing of the substrate, including process for which the mask was formed. In some embodiments, an additive, such as a pigment, a luminescent material or the like may render the hot melt adhesive readily discernible from a substrate, such as an electronic substrate, to which the hot melt adhesive has been applied.

In another aspect, a method for selectively masking a substrate, such as an electronic substrate, is disclosed. Such a method includes selectively applying a hot melt adhesive to locations of the substrate that are to be protected from a subsequently deposited material, such as a protective coating. As the hot melt adhesive is applied to a substrate, it may be readily discernible from the substrate. Such discernibility may enable and/or facilitate inspection of the substrate (e.g., visually, with inspection equipment, etc.) to ensure that the hot melt adhesive has been applied to one or more appropriate locations of the substrate. When the hot melt adhesive solidifies (i.e., cools and hardens) to define a mask on the substrate, it may be readily discernible from the substrate. Application of a hot melt adhesive to a substrate may be effected alone or in conjunction with other masking techniques (e.g., the use of other selective masking materials, such as latex, grease, etc.; the use of preformed masks that are defined before their application to the substrate; etc.).

Masked substrates are also within the scope of the disclosure.

With one or more masks in place, the substrate may be processed through the mask. In a specific embodiment, processing of the substrate may comprise application of a protective coating to exposed locations of the substrate (e.g., locations of the substrate exposed through the mask, etc.). The protective coating may also be applied to the mask. In more specific embodiments, application of the protective coating may comprise application of a parylene (i.e., an unsubstituted or substituted poly(p-xylylene)) coating to exposed locations of the substrate. The material from which the mask(s) is (are) formed may be formulated or otherwise configured to withstand processing in a manner that prevents subjection of masked locations of the substrate to the processing. In embodiments where the processing comprises application of a protective coating to the substrate (and to the mask), the material of the mask may be formulated or otherwise configured to withstand the process(es) by which the protective coating is applied. Without limitation, such processes may include chemical vapor deposition (CVD) processes, atomic layer deposition (ALD) processes, exposure to energy (e.g., exposure to electromagnetic radiation, exposure to a plasma, etc.) and/or a variety of other processes.

Substrates that are masked and protectively coated, with the protective coating on a mask according to this disclosure, are also disclosed.

After the subsequent processing for which the selective mask has been applied (e.g., application of a protective coating, etc.) is complete, the selective mask may be readily discernible from the substrate. Such discernibility may facilitate and/or enable ready removal of the mask from the substrate.

Once the mask is no longer needed (e.g., after processes for which the mask was applied are complete), the mask may be removed from the substrate. Removal of the mask may include identifying the mask. Identification of the mask may be facilitated by its ready discernibility from the substrate, or at least from a portion of the substrate to which the mask was applied. Such identification may be conducted visually or with automated equipment. Once the mask has been identified, it may be selectively removed from the substrate. Selective removal of the mask may comprise mechanical removal of the mask, such as grasping and peeling it off of the substrate (e.g., manually, with automated equipment, etc.).

Other aspects, as well as the features and advantages of various aspects, of the disclosed subject matter will become apparent to those of ordinary skill in the art from the ensuing description, the accompanying drawings, and the appended claims.

DETAILED DESCRIPTION

Figure 1A:
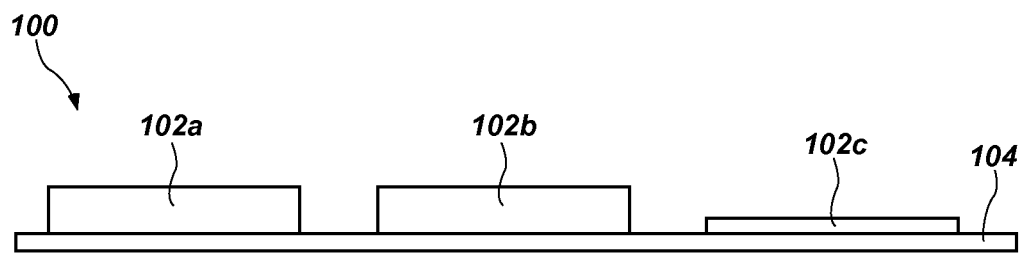
FIGS. 1A to 1C schematically represent an embodiment of a method of applying a mask to a substrate, such as a subassembly of an electronic device.
Figure 1B:
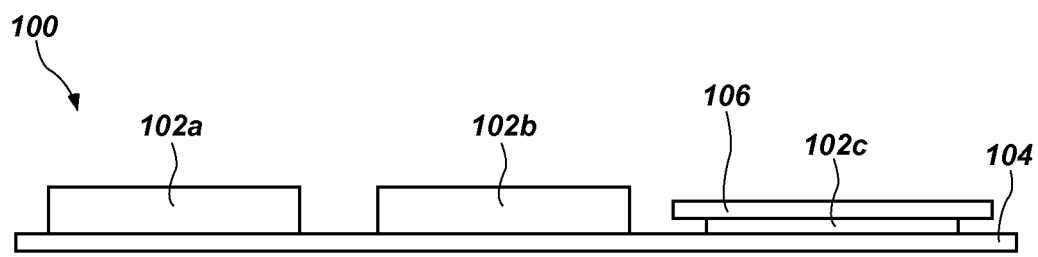
Figure 1C:
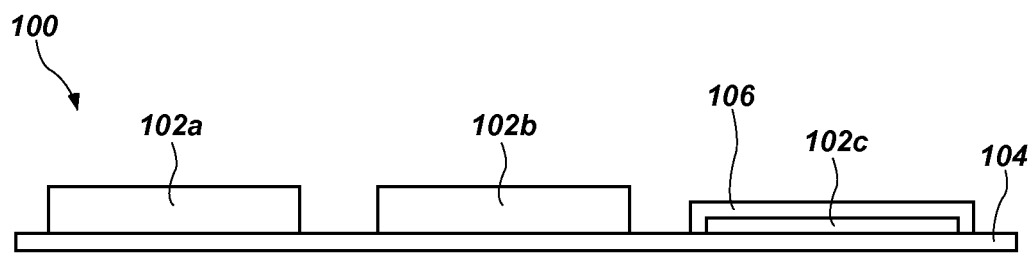

FIGS. 1A through 1C illustrate an embodiment of a substrate 100. In the depicted embodiment, the substrate 100 comprises a subassembly or an assembly of an electronic device. The substrate 100 may comprise all or part of a portable electronic device, such as a cellular telephone, a tablet computer, a camera, a global positioning system (GPS) receiver, a laptop computer, or any other electronic device. In an embodiment where the substrate 100 comprises a subassembly of an electronic device, it may include a printed circuit board (PCB) or other carrier 104 and one or more components or features 102a-c (e.g., semiconductor devices (e.g., processors, microcontrollers, memory devices, etc.), resistors, capacitors, ports, connectors, electrical contacts, buttons, switches, other components or features, etc.) on the carrier 104. In embodiments where the substrate 100 comprises a subassembly of an electronic device, it may also include other components, such as a display, all or part of a housing, or input/output elements. In another embodiment, the substrate 100 may comprise an entire electronic device.

As used herein, the terms "component" and "feature" are used broadly to encompass a variety of elements of a substrate 100, such as an electronic device. Certain components or features 102a-c may benefit from being covered or shielded by a protective coating (e.g., to prevent their exposure to moisture, contamination, etc.). However, a protective coating may adversely affect the operation or performance of other components or features 102a-c. Accordingly, it may be desirable to ultimately leave some components or features 102a-c uncoated.

A component or feature 102c of the substrate 100, or any other area of the substrate 100 (which area may include at least part of one or more components), that is to be covered by the mask material 106 may be referred to herein as a "selected area" or as a "masked component."

FIG. 1B illustrates a mask material 106 being placed on a component 102c of a substrate 100. The mask material 106 may be selected from a variety of materials that will prevent a protective coating from adhering to a location of the substrate (e.g., over a component or feature 102c, etc.) that is to be exposed through the protective coating. Use of a mask material 106 may be particularly useful where the protective coating is applied using non-selective techniques, such as chemical vapor deposition (CVD), atomic layer deposition (ALD), molecular diffusion, physical vapor deposition (PVD) (e.g., evaporation deposition (including, but not limited to e-beam evaporation, sputtering, laser ablation, pulsed laser deposition, etc.), or physical application processes (e.g., printing, spray-on techniques, rolling, brushing, etc.), which coat exposed components or features regardless of whether or not coating of all components or features is desired.

The mask material 106 may be formulated or otherwise configured to bond to the substrate 100 in such a way that the resulting mask will prevent selected areas of the substrate 100 from being exposed to subsequent processing (e.g., the application of a protective coating, etc.), while enabling a mask that has been formed from the mask material 106 to be easily removed from the substrate 100 (e.g., by peeling, etc.) once such processing is complete, and while leaving little or no residue (e.g., fugitive adhesive, etc.) on the substrate 100. It may also be desirable to use a mask material 106 that does not react chemically with the features of or on the substrate 100 that are being masked.

The mask material 106 may be formulated or otherwise configured, once it has solidified, to withstand parameters of subsequent processing that will occur while the mask material 106 remains in place on the substrate 100. In embodiments where the mask material 106 is used to define a mask that enables a protective coating to be applied only to selected locations of the substrate 100, the mask material 106 may be formulated or otherwise configured to withstand the conditions (e.g., temperatures, pressures, chemicals, etc.) associated with application of a protective coating to the substrate 100.

The mask material 106 may be formulated or configured to be readily discernible from the substrate 100 to which it is applied (e.g., the entire substrate 100, features surrounding the location(s) of the substrate 100 to which the mask material 106 is to be applied, etc.).

Such ready discernibility may be present when the mask material 106 is initially applied to a substrate 100. In embodiments where the mask material 106 comprises a hot melt adhesive, the mask material 106 may be readily discernible from the substrate 100 before the mask material 106 solidifies (i.e., cools and hardens). Discernibility of the mask material 106 from the substrate 100 at this point enables inspection of the mask material 106 and, if necessary, removal of the mask material 106 from the substrate 100 to enable proper application of the mask material 106 to the substrate 100.

The mask material 106 may be discernible from the substrate 100 once a mask is defined from the mask material 106. In embodiments where the mask material 106 comprises a hot melt adhesive, the mask material 106 may be readily discernible from the substrate 100 once the mask material 106 solidifies. Discernibility of the mask material 106 from the substrate 100 once the mask and the substrate 100 are ready for subsequent processing facilitates inspection of the mask and, if necessary, removal of the mask from the substrate 100 to enable proper formation of a mask on the substrate 100.

The mask material 106 may be readily discernible from the substrate 100 after the substrate 100 has been processed. In embodiments where the mask material 106 comprises a hot melt adhesive 106 and the processes relate to the formation of a protective coating (e.g., a parylene coating, etc.) on selected surfaces of the substrate 100 (e.g., surfaces that are not coated by the mask), the mask material 106 may be readily discernible from the substrate 100, and may even be detectible and discernible from the substrate 100 through the protective coating. Such detectability and/or discernibility may facilitate identification and/or location of a mask formed from the mask material, as well as removal of the mask portions of the protective film thereover from the substrate 100.

Ready discernibility of a mask material 106 may also enable confirmation that the mask has an appropriate, or sufficient, thickness and/or confluence to prevent the application of a protective coating to one or more predetermined locations a substrate and/or to enable removal of the mask and protective coating thereover in a desired manner. When used in conjunction with automated processes, a discernible mask material 106 may remove the potential for human error from the masking process and, optionally, the demasking processes.

Such discernibility of the mask material 106 may enable inspection of a mask formed from the mask material 106 (e.g., its boundaries, etc.) to ensure that it has been accurately and precisely formed on the substrate 100 and, thus, mapping of the boundaries of a mask. For example, a discernible mask material 106 may facilitate inspection of the boundaries of a mask to ensure that the mask extends to a sufficient peripheral extent (within a predetermined tolerance) but does not extend significantly beyond that peripheral extent (within a predetermined tolerance).

Color, luminescence or another discernible characteristic of the mask material 106 may also enable visualization (e.g., by eye, with automated inspection equipment, etc.) of any portions of a mask that may remain after the majority of the mask has been removed (e.g., peeled, etc.) from the substrate 100, which may facilitate complete removal of the mask from the substrate 100.

Discernibility of the mask material 106 from the substrate 100 may be achieved in a variety of ways. As an example, a color of the mask material 106 may render it readily discernible from a substrate 100 to which the mask material 106 is to be applied. More specifically, the color of the mask material 106 (e.g., orange, etc.) may differ from the colors of features of or on the substrate 100 to render the mask material 106 readily distinguishable and discernible from features of or on the substrate 100. Color may be an inherent property of the mask material 106, or it may be added to the mask material 106. For example, a pigment may be mixed into the mask material 106 to impart it with a particular color. As another option, the mask material 106 may comprise a luminescent material (e.g., a dye, etc.) to render the mask material 106 readily discernible from a substrate 100. More specifically, luminescence may be an inherent property of the mask material 106, or of one or more components of the mask material 106, or a luminescent material may be added to the mask material 106. The color, luminescence or other type of discernibility of a mask material 106 may render the mask material 106 visibly discernible from the substrate 100, or at least from adjacent features on the substrate 100 (e.g., by an individual's eye, etc.), discernible from the substrate 100 by automated inspection equipment, or both visibly and automatedly discernible from the substrate 100. In a specific embodiment, the mask material 106 may comprise a pigmented, or colored, low temperature hot glue (e.g., a hot glue with a softening point of about 97° C. to about 197° C., etc.). Examples of low temperature hot glues include those available from Henkel AG & Company, KGaA of Dusseldorf, Germany, under the TECHNOMELT trademark (e.g., TECHNOMELT TACK™ 003A hot glue, etc.) or the hot melt adhesive sold as GIA 1057 Permanent EVA by Glue Machinery Corporation of Baltimore, Md., with which pigment(s) have been mixed to impart the low temperature hot glue with a desired color. Such a mask material 106 may be particularly useful for masking components or features 102c of a substrate 100 that are delicate or sensitive to heat (e.g., when the substrate 100 comprises a subassembly of an electronic device, an assembled electronic device, etc.).

FIG. 1C shows a mask material 106 that conforms to the shape of the component or feature 102c; in the illustrated embodiment, the mask material 106 may conform to surfaces that are oriented transverse to the direction from which the mask material 106 is applied (e.g., to the sides of the component or feature 102c, etc.). Additional forces (e.g., mechanical force, positive pressure, a vacuum, etc.) may be applied to the mask material 106 that cause it to substantially conform to the shape of the component or feature 102c.

In a more specific embodiment, where the mask material 106 comprises a hot melt adhesive, such as a low temperature hot glue, the hot melt adhesive may be heated to its softening point and, while remaining at a temperature at or above its softening point, applied to a substrate 100. More specifically, the mask material 106 may be heated, dispensed and selectively applied to a substrate 100 with a suitable apparatus, such as the hot glue gun available from Glue Machinery Corp. as CHAMP 10 LCD, using an appropriate nozzle (e.g., a 1.5 mm inner diameter (ID), 1.8 mm outer diameter (OD) nozzle tip, such as that available from Glue Machinery Corp. as part number 3663, etc.). Once the mask material 106 has been applied to the substrate 100, the mask material 106 may flow and conform to the shape of the portion of the substrate 100 to which it is applied (e.g., the component or feature 102c, etc.). Alternatively, the mask material 106 may be molded to the shape of the component 102c before the mask material 106 solidifies (e.g., cools and hardens, etc.).

In the ensuing disclosure, reference numeral 106 may refer to the mask(s) formed from a mask material, rather than to the mask material itself.

With one or more masks 106 in place on the substrate 100, a protective coating 202 may be applied to the substrate 100 in any suitable manner known in the art, using appropriate equipment. A few examples of suitable protective materials and the processes by which they are formed are disclosed in U.S. Patent Application Publication US 2011/0262740 of Martin, et al., U.S. Patent Application Publication US 1014/0268526 of Stevens, et al., U.S. patent application Ser. No. 14/740,193, filed on Jun. 15, 2015, and U.S. patent application Ser. No. 14/740,211, filed on Jun. 15, 2015, the entire disclosure of each of which is hereby incorporated herein.

Figure 2A:
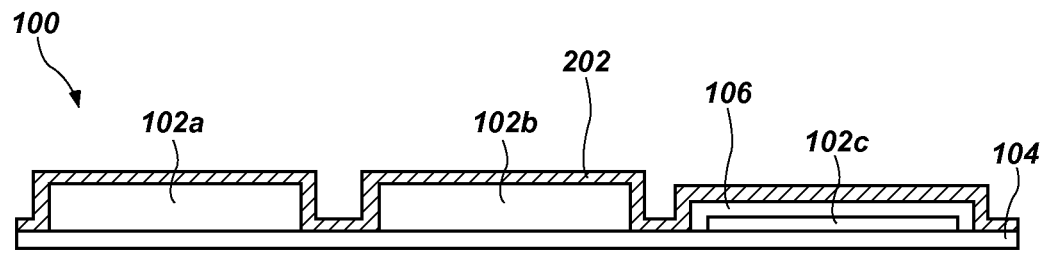
FIGS. 2A to 2C illustrate application of a protective coating to a substrate that has been masked, as well as removal of the mask and portions of the protective coating over the mask.

FIG. 2A illustrates an embodiment of a substrate 100 to which a protective coating 202 has been applied. The protective coating 202 may be configured to protect the substrate 100 from moisture (e.g., various forms of water, aqueous substances, other liquids, etc.) and/or contamination. The protective coating 202 may cover all exposed surfaces of the substrate 100, including any masks 106 on the substrate 100.

Figure 2B:
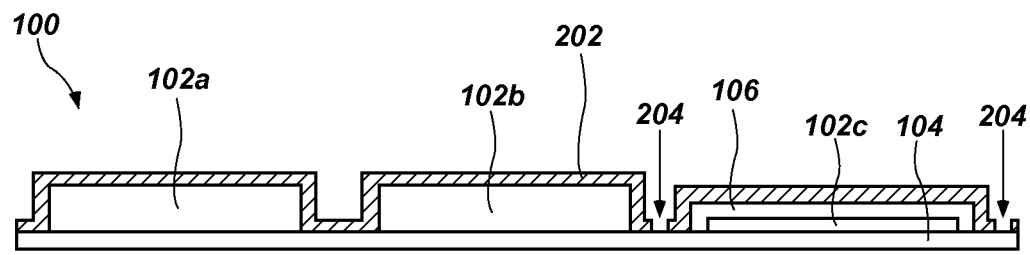

Turning now to FIG. 2B, once a protective coating 202 has been formed on a substrate 100 and over any masks 106 on the substrate 100, a cut 204 may be formed in one or more selected portions of the protective coating 202. Each cut 204 may facilitate removal of the mask 106 and the portion of the protective coating 202 over the mask 106 from the substrate 100. Each cut 204 may extend around a location from which a portion of the protective coating 202 is to be removed; for example, around the perimeters of the mask 106.

The term "cut," as used herein, includes a severed or weakened locations of a protective coating 202. Without limitation, a cut 204 may refer to a physical break of sufficient depth in the protective coating 202 to reach the substrate 100 or otherwise extend entirely through the protective coating 202. In such an embodiment, the cut 204 may sever, or separate, a portion of the protective coating 202 that resides over a component or feature 102c covered by a mask 106 from adjacent portions of the protective coating 202 that are to remain in place over the substrate 100. In another embodiment, the cut 204 may comprise a weakened location (e.g., a shallow incision, etc.) that does not extend completely through the protective coating 202. As another alternative, the cut 204 may comprise a series of perforations in the protective coating 202.

The cut 204 may be formed in a variety of ways, including, but not limited to, those disclosed by the U.S. Provisional Patent Application No. 61/750,257, filed on Jan. 8, 2013 and titled METHODS FOR REMOVING PROTECTIVE COATING FROM AREAS OF AN ELECTRONIC DEVICE, by U.S. Provisional Patent Application No. 61/750,254, filed on Jan. 8, 2013 and titled METHODS FOR MASKING ELECTRONIC DEVICES FOR APPLICATION OF PROTECTIVE COATINGS AND MASKED ELECTRONIC DEVICES, and by PCT international patent application no. PCT/US2014/010510, filed on Jan. 7, 2014 and titled REMOVAL OF SELECTED PORTIONS OF PROTECTIVE COATINGS FROM SUBSTRATES, the entire disclosures of which are hereby incorporated herein.

Making a cut 204 before removing the mask 106 and portions of the protective coating 202 over the mask 106 may reduce the likelihood of tearing the protective coating 202 or otherwise unintentionally removing it from locations where it is supposed to remain.

Figure 2C:
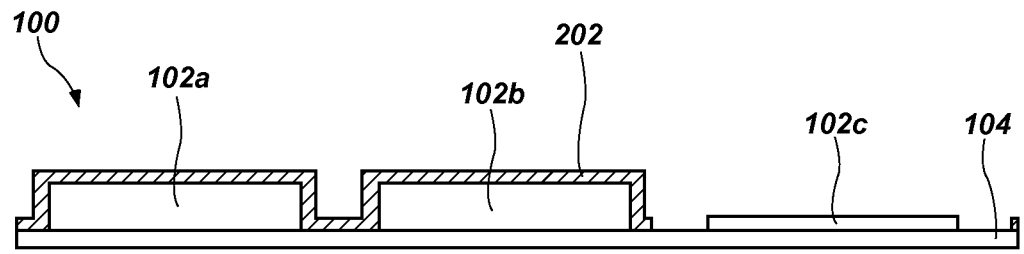

As seen in FIG. 2C, after the cut 204 is formed, the portion of the protective coating 202 that is to be removed from the substrate 100 and the corresponding mask 106 may be removed from the substrate 100. As a result, the portion(s) of the substrate 100 that were covered by the mask 106 (e.g., the component or feature 102c, etc.) may be exposed through the protective coating 202, while other portions of the substrate 100 (e.g., the components or features 102a and 102b, etc.) may continue to be covered by the protective coating 202.

Removal of portions of the protective coating 202 and the mask 106 from the substrate 100 may be effected manually or as part of an automated process. In one embodiment, pick-and-place apparatus (e.g., a vacuum head, etc.) may be moved over the protective coating 202 after one or more cuts 204 are formed to selectively remove (e.g., pull, etc.) each cut portion of the protective coating 202 and the underlying mask 106 from the substrate 100, leaving desired areas (e.g., the component or feature 102c, etc.) exposed, as shown in FIG. 2C.

When a plurality of different discernible mask materials are used to form a plurality of masks 106, the discernible characteristic of the mask material from which each mask 106 is formed may provide an indication of when the mask 106 and/or the protective coating 202 located over the mask 106 are/is to be removed, provide an indication of the process(es) by which the protective coating 202 and/or mask 106 are/is to be removed, or provide a combination of timing and processing information. Such information may provide a process flow "map" that may be used manually or by automated material removal equipment to ensure that a mask 106 and a portion of a protective coating 202 thereover are removed from a predetermined surface, area and/or plane of a substrate.

Although the foregoing disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A method for selectively masking a substrate, comprising:

providing a process flow map that relates a first discernible characteristic of a plurality of discernible characteristics to a first process of a plurality of processes by which a mask material is to be removed and further relates a second discernible characteristic of a plurality of discernible characteristics to a second process of a plurality of processes by which a mask material is to be removed;

adding a first additive to a first mask material to change a discernible characteristic of the first mask material rendering the first mask material with the first discernible characteristic to provide an indication that the first mask material is associated with the first process of the plurality of processes is used;

adding a second additive to a second mask material to change a discernible characteristic of the second mask material rendering the second mask material with the second discernible characteristic different from the first discernible characteristic to provide an indication that the second mask material is associated with the second process of the plurality of processes is used, wherein the second additive is different from the first additive, and wherein the second additive causes the second discernible characteristic to be different from the first discernible characteristic;

applying the first mask material comprising a hot melt adhesive to a first component of a substrate, the hot melt adhesive being readily discernible from the substrate, wherein the first mask material is detectable through a protective coating;

applying the second mask material comprising the second discernible characteristic;

applying a protective coating comprising poly(p-xylylene) over the first mask material and the second mask material and the substrate;

detecting the first discernible characteristic and the second discernible characteristic through the protective coating; and removing the first mask material by the first process and the second mask material by the second process according to the process flow map, wherein the second process is different type of removal process from the first process.

2. The method of claim 1, wherein:

the second mask material is automatedly discernible from the first mask material.

3. The method of claim 2, wherein the second mask material is visibly discernible from the first mask material by color.

4. The method of claim 1, wherein:
the second mask material is automatedly discernible from the substrate; and
the method further comprises automatedly discerning the second mask material from the substrate.

5. The method of claim 1, wherein the first mask material comprises a luminescent material to render the first mask material readily discernible from the substrate.

6. The method of claim 1, wherein the first discernible characteristic indicates when to remove the first mask material.

7. The method of claim 1, wherein the second mask material further comprises a dye, wherein a color of the dye indicates to use the second process different from the first process.

8. A method for protectively coating a substrate, comprising:
providing a process flow map that relates a first discernible characteristic of a plurality of discernible characteristics to a first process of a plurality of processes by which a mask material is to be removed and further relates a second discernible characteristic of a plurality of discernible characteristics to a second process of a plurality of processes by which a mask material is to be removed;
adding a first additive to a first mask material to change a discernible characteristic of the first mask material rendering the first mask material with the first discernible characteristic to provide an indication that the first mask material is associated with the first process of the plurality of processes is used;
adding a second additive to a second mask material to change a discernible characteristic of the second mask material rendering the second mask material with the second discernible characteristic different from the first discernible characteristic to provide an indication that the second mask material is associated with the second process of the plurality of processes is used, wherein the second additive is different from the first additive, and wherein the second additive causes the second discernible characteristic to be different from the first discernible characteristic;
applying a first mask material comprising a hot melt adhesive to a first component of a substrate to form a first mask on the substrate, the hot melt adhesive being readily discernible from the substrate, wherein the first mask material comprises the first discernible characteristic;
applying a protective coating to areas of the substrate exposed through or beyond the mask, wherein the first mask material is detectible through the protective coating;
detecting the first discernible characteristic through the protective coating; and
removing the first mask material and portions of the protective coating that overlie the first mask from the substrate by the first process, with portions of the protective coating that have been formed on the substrate remaining on the substrate and removing the second mask material by the second process, wherein the second process is different type of removal process from the first process.

9. The method of claim 8, wherein the method further comprises:
adding a second additive to a second mask material to change a discernible characteristic of the second mask material rendering the second mask material with the second discernible characteristic to provide an indication that the second mask material is associated with the second process of the plurality of processes is used;
applying a second mask material comprising the second discernible characteristic, wherein the second discernible characteristic is visibly discernible from the first discernible characteristic.

10. The method of claim 8, wherein:
the first mask material is automatedly discernible from the substrate; and
the method further comprises automatedly discerning the first mask material from the substrate.

11. The method of claim 8, further comprising:
cutting or weakening the protective coating at locations over an outer periphery of the first mask prior to removing the first mask and the portions of the protective coating that overlie the first mask from the substrate.

12. The method of claim 8, wherein the first discernible characteristic of the first mask comprises color or luminescence, wherein the color or luminescence indicates to use the first process, and wherein the second discernible characteristic of the second mask comprises a different color or luminescence, wherein the different color or luminescence indicates to use the second process.

13. The method of claim 8, wherein the first discernible characteristic renders the first mask material visible through a protective coating.

* * * * *